United States Patent [19]
Watanabe et al.

[11] Patent Number: 5,994,962
[45] Date of Patent: Nov. 30, 1999

[54] DIFFERENTIAL AMPLIFIER DEVICE

[75] Inventors: Shigemitsu Watanabe; Hiromi Katoh, both of Atsugi, Japan

[73] Assignee: Mitsumi Electric Co., Ltd., Tokyo, Japan

[21] Appl. No.: 08/920,730

[22] Filed: Aug. 29, 1997

[30] Foreign Application Priority Data

Aug. 29, 1996  [JP]  Japan .................................. 8-228395

[51] Int. Cl.⁶ ....................................................... H03F 3/45
[52] U.S. Cl. ............................................................. 330/257
[58] Field of Search ................................ 330/252, 257, 330/288

[56] References Cited

U.S. PATENT DOCUMENTS 4,429,283  1/1984  Wittlinger ............................. 330/257
4,523,105  6/1985  Jose et al. ........................... 330/257 X
4,987,380  1/1991  Ishikawa ............................. 330/257 X
5,668,501  9/1997  Venes .................................. 330/257 X

*Primary Examiner*—Steven J. Mottola
*Attorney, Agent, or Firm*—Frishauf, Holtz, Goodman, Langer & Chick, P.C.

[57] ABSTRACT

A differential amplifier produces a collector current of an output side transistor as an output current signal. In this case, a power supply voltage or a closer voltage to the power supply voltage is supplied to a collector terminal of the output side transistor. First and second current mirror circuits produce a current signal in response to the output current signal. The produced current signal passes through a resistor, a terminal of which is connected to a reference voltage. When the produced current signal passes through the resistor, a voltage drop from the reference voltage occurs at the resistor. By utilizing the voltage drop at the resistor, an output voltage changing in response to two output voltage signals is produced.

20 Claims, 4 Drawing Sheets

DIFFERENTIAL AMPLIFIER DEVICE

BACKGROUND OF THE INVENTION

This invention relates to a differential amplifier device which includes two transistors as a differential pair and, in particular, to a differential amplifier device having a current-to-voltage converter which converts, into a voltage signal, a current signal outputted from one of the two transistors.

The differential amplifier, a main part of the differential amplifier device, produces a current signal corresponding to difference between two input voltages. Generally, the differential amplifier comprises a differential pair, and two transistors having a particular property. Now, description will be made about a case in which two npn-type transistors are employed as a differential pair. Power supply voltage is applied to a collector terminal of one of the transistors of the differential pair. In this condition, two input voltages are supplied to base terminals of the two transistors, respectively. In the case where the other transistor of the differential pair is an output transistor, a collector of the output transistor receives a collector current having a current value dependent on the difference between the two input voltages as an output current signal which the differential amplifier produces.

In order to obtain a voltage signal, which changes in response to the difference between the two input voltages, by using the output current signal which the differential amplifier produces, the differential amplifier device requires a current-to-voltage converter to convert a current signal to a voltage signal.

A conventional differential amplifier device comprises a current-to-voltage converter only consisting of a resistor. The resistor comprises two terminals. One of the terminals is connected to a collector terminal of an output transistor of the differential amplifier, and another terminal is applied with a reference voltage. In accordance with this current-to-voltage converter, the output current signal from the differential amplifier goes through the resistor. At that time, a voltage drop from the reference voltage occurs at the resistor. The conventional current-to-voltage converter generates a voltage signal by utilizing the voltage drop.

However, the conventional differential amplifier device has the following problem, that is, a collector current value of the output transistor is limited.

Generally, a reference voltage is lower than a power supply voltage because stepping down the power supply voltage produces the reference voltage. If the difference between the reference voltage and the source voltage is large, a value of the output current signal does not reach a theoretical value which depends on the difference between two input voltages but is limited to a level lower than above-mentioned theoretical value.

SUMMARY OF THE INVENTION

It is an object of this invention to provide a differential amplifier device which comprises a current-to-voltage converter which frees an output current signal from limitation even if there is a large difference between a reference voltage and a power supply voltage.

According to this invention, there is provided a differential amplifier device comprising a differential amplifier for producing an output current as a differential output corresponding to a difference in voltage between two input voltage signals and a current-to-voltage converter for converting the output current to a voltage, wherein:

the differential amplifier comprises a first transistor and a second transistor both connected differentially, the first transistor, which has an output terminal, for producing a first current signal as the differential output, the second transistor substantially having the same property as the first transistor, and;

the current-to-voltage converter comprises a first current mirror circuit, a second current mirror circuit, and a current-to-voltage converting resistor, the first current mirror circuit having a third transistor, connected to the output terminal of the first transistor, for functioning as a diode to pass the first current signal, and a fourth transistor, connected to the third transistor, for producing a second current signal corresponding to the first current signal flowing into the third transistor, the second current mirror circuit having a fifth transistor, connected in series to the fourth transistor, for functioning as a diode to pass the second current signal that the fourth transistor produces, and a sixth transistor, connected to the fifth transistor, for producing a third current signal corresponding to the second current signal flowing into the fifth transistor, the current-to-voltage converting resistor having two terminals and being for converting the third current signal to a voltage signal, one of the terminals being connected in series to the sixth transistor, the other of the terminals being supplied with a reference voltage.

A closer voltage value to the power supply voltage than the reference voltage can be supplied to the first transistor through the first current mirror circuit. Therefore, the first current signal accurately responds to the difference between the two input voltages with no limitation of the reference voltage. This first current signal is converted to the second current signal through the first current mirror circuit, thereafter, the second current signal is converted to the third current signal through the third current signal, and finally the third current signal is transmitted to the current-to-voltage converting resistor. Transmitting the third current signal on this current-to-voltage converting resistor, a voltage drop from the reference voltage occurs at this current-to-voltage converting resistor. Thus, a voltage signal can be obtained. This voltage signal accurately responds to the difference between the two input voltages because the first current signal depends on a voltage which is more similar to the power supply voltage than the reference voltage.

DESCRIPTION OF THE PREFERRED EMBODIMENT

Prior to description of embodiments of this invention, a conventional differential amplifier device will at first be described for better understanding of this invention.

Figure 1:
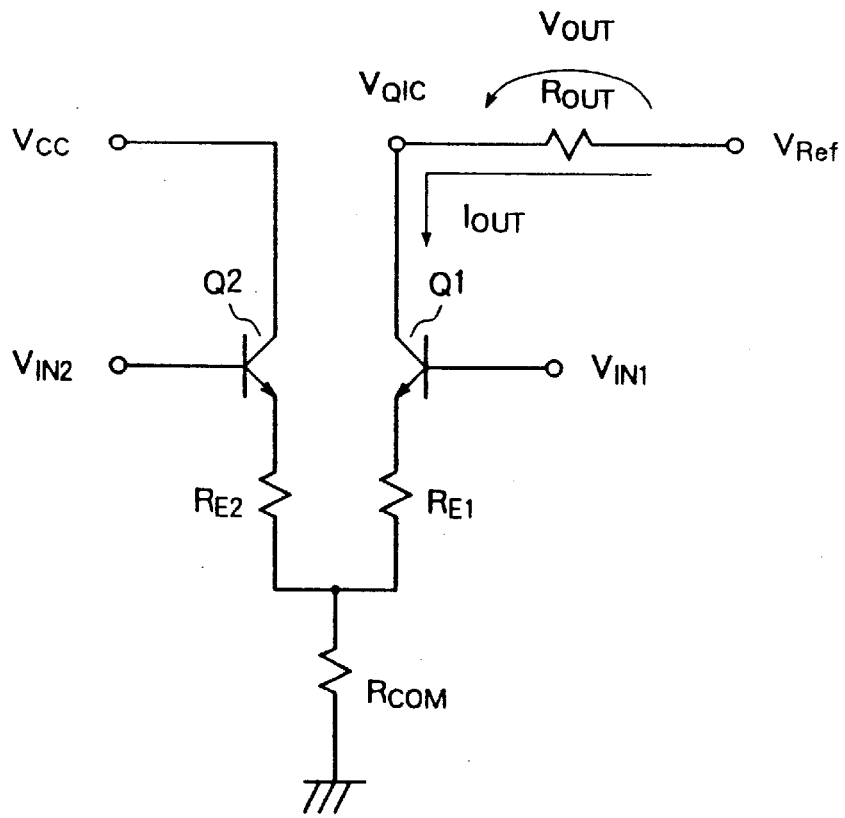
FIG. 1 is a circuit diagram of a conventional differential amplifier device.

With reference to FIG. 1, the conventional differential amplifier device comprises a differential amplifier and a current-to-voltage converter employing a current-to-voltage converting resistor $R_{OUT}$.

The differential amplifier comprises first and second transistors Q1 and Q2, first and second emitter resistors $R_{E1}$ and $R_{E2}$, and a common resistor $R_{COM}$. The first and the second transistors Q1 and Q2 have the same property. Each of the first and the second emitter resistors $R_{E1}$ and $R_{E2}$ has two terminals. Terminals of the first and the second emitter resistors $R_{E1}$ and $R_{E2}$ are connected to emitters of the transistors Q1 and Q2, respectively. The other terminals of the first and the second emitter resistors $R_{E1}$ and $R_{E2}$ are both connected to a terminal of the common resistor $R_{COM}$. A power supply voltage $V_{CC}$ is supplied to a collector of the second transistor Q2.

The current-to-voltage converting resistor $R_{OUT}$ constituting the current-to-voltage converter has two terminals. One of the terminals of the current-to-voltage converting resistor $R_{OUT}$ is connected to a collector of the first transistor Q1, and a reference voltage $V_{Ref}$ is supplied to another terminal of the current-to-voltage converting resistor $R_{OUT}$.

The differential amplifier device having the above-mentioned structure produces an output voltage signal $V_{OUT}$ corresponding to the difference between the first and the second input voltage signals $V_{IN1}$ and $V_{IN2}$ when the first and the second input voltage signals $V_{IN1}$ and $V_{IN2}$ are inputted to bases of the first and the second transistors Q1 and Q2, respectively. Specifically, the collector current of the first transistor Q1 changes in response to the difference between the first input voltage signal $V_{IN1}$ and the second input voltage signal $V_{IN2}$. The differential amplifier produces this collector current as an output current signal $I_{OUT}$. The output current signal $I_{OUT}$ produced by the differential amplifier passes through the current-to-voltage converting resistor $R_{OUT}$, thereby voltage drop from the reference voltage $V_{Ref}$ occurs at the current-to-voltage converting resistor $R_{OUT}$. This voltage drop yields a voltage difference across the current-to-voltage converting resistor $R_{OUT}$. As described above, the differential amplifier device produces an output voltage signal $V_{OUT}$ as a difference voltage between the reference voltage $V_{Ref}$ and a collector voltage $V_{Q1C}$ of the first transistor, receiving the first and the second input voltage signals $V_{IN1}$ and $V_{IN2}$.

However, the conventional differential amplifier device has a problem that a current value of a current signal produced as a differential output is limited. Further description about this problem will be made below.

As regards the differential amplifier device shown in FIG. 1, a following assumption will be made as an example; the power supply voltage $V_{CC}$, the second input voltage signal $V_{IN2}$, the reference voltage $V_{Ref}$, the first and the second emitter resistors $R_{E1}$ and $R_{E2}$, the common resistor $R_{COM}$, and the current-to-voltage converting resistor $R_{OUT}$ are $V_{CC}$=3V, $V_{IN2}$=1.5V, $V_{Ref}$=1.5V, $R_{E1}$=$R_{E2}$=10kΩ, $R_{COM}$= 100kΩ, $R_{OUT}$=100kΩ, respectively. And both $V_{BE1}$ and $V_{BE2}$, voltages between the emitters and the bases of the first transistor Q1 and the second transistor Q2, are about 0.7V. Under this assumption, $I_{MAX}$, a sum of an emitter current $I_{E2}$ of the second transistor Q2 and an emitter current $I_{E1}$ of the first transistor Q1, can be given by Equation (1).

$$I_{MAX} = (V_{IN2} - V_{BE})/(R_{E2} + R_{COM}) \quad (1)$$
$$= (1.5 - 0.7)/(10k + 100k)$$
$$= 7.3\mu$$

As well known in the art, in case where a voltage difference between two input voltages is greater than a certain level in a differential amplifier, a collector current as an output is saturated.

Figure 2:
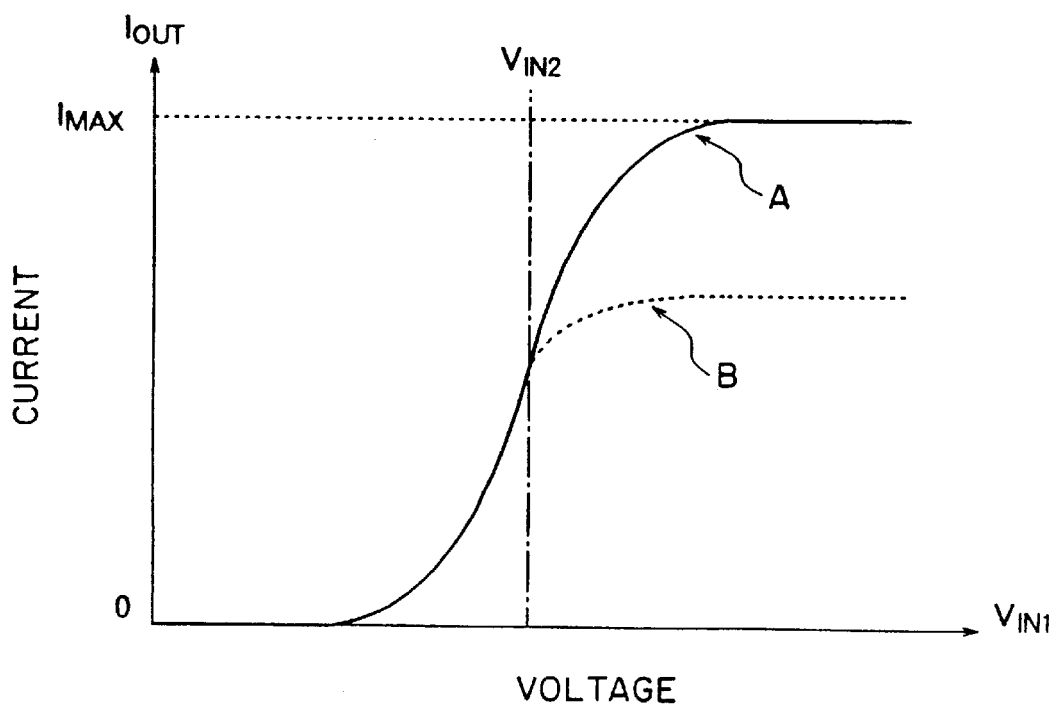
FIG. 2 is a view for describing a problem of the conventional differential amplifier device.

As shown in FIG. 2, in the situation the output of the differential amplifier is completely saturated, a current having the value of Equation (1), $I_{MAX}$, should flow as the collector current of the first transistor Q1. Thus, about 7.3μ A of a current at the maximum should flow into the current-to-voltage converting resistor $R_{OUT}$.

Now, an assumption will be made that about 7.3μ A of a current at the maximum flows into the current-to-voltage converting resistor $R_{OUT}$. A total voltage $V_{MAX}$, which is produced when the current $I_{MAX}$ (=7.3μA) flows through the first emitter resistor $R_{E1}$, the common resistor $R_{COM}$, and the current-to-voltage converting resistor $R_{OUT}$, can be given by Equation (2) as:

$$V_{MAX} = (R_{E1} + R_{COM} + R_{OUT}) \times I_{MAX} + V_{CE} \quad (2)$$
$$= (10k + 100k + 100k) \times 7.3\mu A + 0.3V$$
$$= 1.833V > V_{Ref}(=1.5V),$$

where $V_{CE}$, a voltage between the collector and the emitter of the first transistor Q1, is 0.3V.

As shown in Equation (2), the voltage $V_{MAX}$ is 1.833V, whose value exceeds 1.5V of the reference voltage $V_{Ref}$. Since this situation never occurs in practice, the above-mentioned assumption according to the output current of the first transistor Q1 can not be made. Thus, it can be understood that the output current of the first transistor Q1 is limited en route, failing to reach the theoretical maximum value 7.3μ A as shown by a curve B in FIG. 2.

In addition, it seems that the output current is not limited if the values of the first and the second emitter resistors $R_{E1}$ and $R_{E2}$, the common resistor $R_{COM}$, and the current-voltage conversion output resistor $R_{OUT}$, are small. However, these resistor values are often chosen considering the consumption current, the current-voltage conversion gain of the device, etc., therefore can not be determined without careful consideration to various kinds of the conditions.

As mentioned above, the conventional differential amplifier device can not produce the ideal output voltage in case where the difference voltage between the reference voltage and the power supply voltage is greater than a certain level. However, the differential amplifier device according to this invention solves the problem of the conventional device.

Now, a preferred embodiment of this invention will be described with reference to the drawings.

Figure 3:
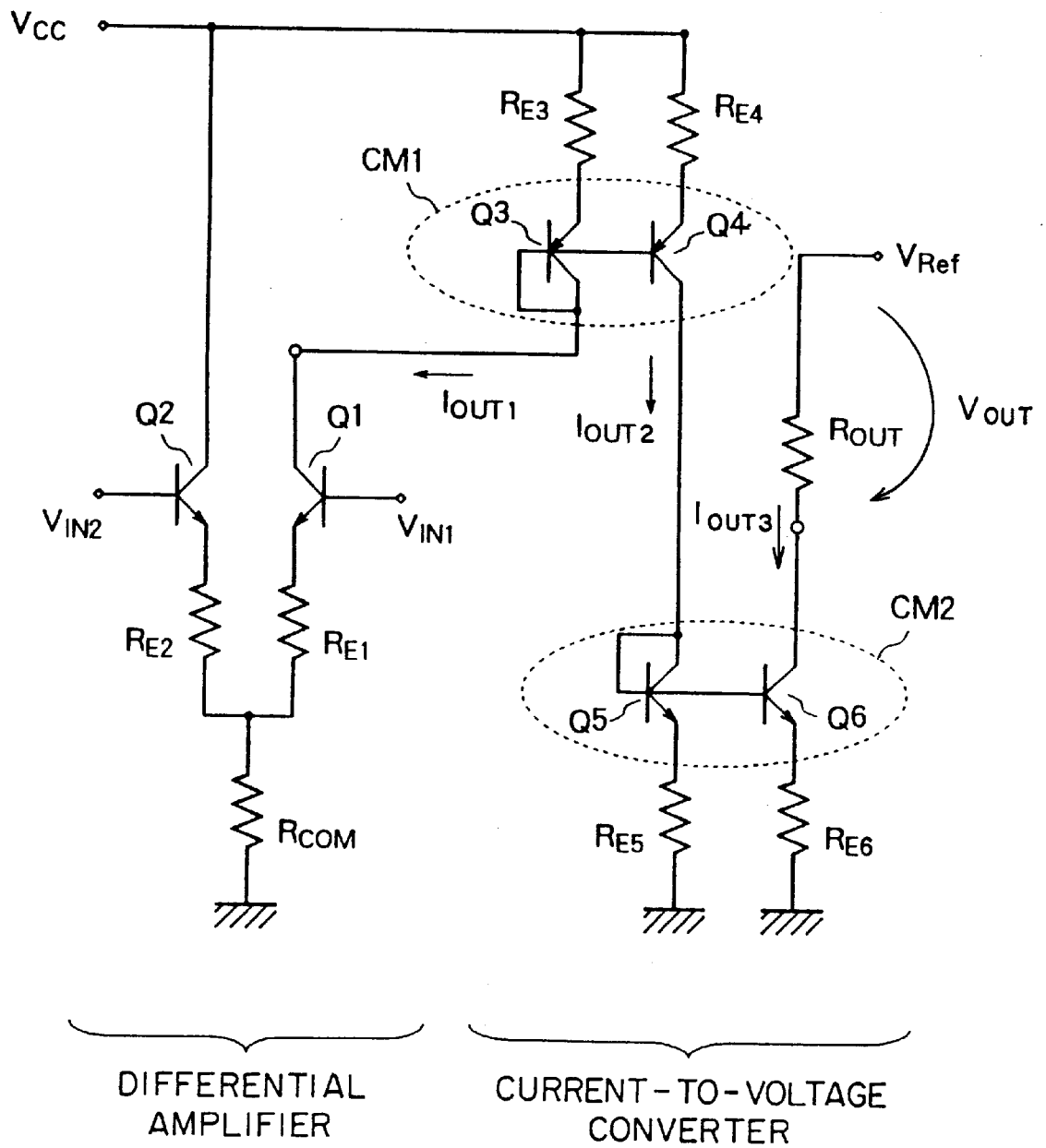
FIG. 3 is a circuit diagram of a differential amplifier device according to a preferred embodiment of this invention.

Referring to FIG. 3, a differential amplifier device according to the preferred embodiment of this invention comprises a differential amplifier and a current-to-voltage converter.

The differential amplifier has first and second transistors Q1 and Q2, first and second emitter resistors $R_{E1}$ and $R_{E2}$, and a common resistor $R_{COM}$. Both first and second transistors Q1 and Q2 have the substantially same property. In this embodiment, the first and the second transistors Q1 and Q2 are both npn-type transistors. And a collector of the second transistor Q2 is supplied with a power supply voltage $V_{CC}$. Terminals of the first and the second emitter resistors $R_{E1}$ and $R_{E2}$ are connected to emitters of the first and the second transistors Q1 and Q2, respectively. The other terminals of the first and the second emitter resistors $R_{E1}$ and $R_{E2}$ are both connected to a terminal of the common resistor $R_{COM}$. The other terminal of the common resistor $R_{COM}$ is connected to the ground.

This differential amplifier produces a collector current of the first transistor Q1 as an output current $I_{OUT1}$ corresponding to a difference voltage between a first input voltage signal $V_{IN1}$ inputted to a base of the first transistor Q1 and a second input voltage signal $V_{IN2}$ inputted to a base of the second transistor Q2.

The current-to-voltage converter has first and second current mirror circuits CM1 and CM2, third through sixth emitter resistors $R_{E3}$–$R_{E6}$, and a current-to-voltage converting resistor $R_{OUT}$.

The first current mirror circuit CM1 comprises third and fourth transistors Q3 and Q4, and produces a first mirror current signal $I_{OUT2}$ changing in response to the output current signal $I_{OUT1}$. The third and the fourth transistors Q3 and Q4 are both pnp-type transistors. The third transistor Q3 has a base and a collector connected to a collector of the first transistor Q1 and functions as a diode through which the output current signal $I_{OUT}$ flows. Bases of the third and the fourth transistors Q3 and Q4 are connected to each other. This first current mirror circuit CM1 produces a first mirror current signal $I_{OUT2}$ in response to the output current signal $I_{OUT1}$ as a collector current of the fourth transistor Q4.

Third and fourth emitter resistors $R_{E3}$ and $R_{E4}$ absorb influence owing to the Early Effects at the third and the fourth transistors Q3 and Q4, respectively. Resistance values of the third and the fourth emitter resistors $R_{E3}$ and $R_{E4}$ affect the setting of a so-called current mirror ratio, a ratio of the current produced by the first current mirror circuit CM1. For instance, in case where the third and the fourth transistors Q3 and Q4 have the same property, the current mirror ratio of the first current mirror circuit CM1 is determined by the ratio of the value of the third emitter resistor $R_{E3}$ to the value of the fourth emitter resistor $R_{E4}$. Terminals of the third and fourth emitter resistors $R_{E3}$ and $R_{E4}$ are connected to the emitters of the third and the fourth transistors Q3 and Q4, respectively. The other terminals of the third and the fourth emitter resistors $R_{E3}$ and $R_{E4}$ are both connected to the power supply voltage $V_{CC}$.

If the third and the fourth transistors Q3 and Q4 have the same property and the third and the fourth emitter resistors $R_{E3}$ and $R_{E4}$ have the same value, the first mirror current signal $I_{OUT2}$ has the same current value of the output current signal $I_{OUT1}$. Thus, $I_{OUT1}$ is equal to $I_{OUT2}$.

The second current mirror circuit CM2 comprises fifth and sixth transistors Q5 and Q6, and produces a second mirror current signal $I_{OUT3}$ changing in response to the first mirror signal $I_{OUT2}$. The fifth and the sixth transistors Q5 and Q6 are both npn-type transistors. The fifth transistor Q5 has a base and a collector connected to a collector of the fourth transistor Q4 and functions as a diode through which the first mirror current signal $I_{OUT2}$ flows. Bases of the fifth and the sixth transistors Q5 and Q6 are connected to each other. This second current mirror circuit CM2 produces the second mirror current signal $I_{OUT3}$ in response to the first mirror current signal $I_{OUT2}$ as a collector current of the sixth transistor Q6.

Fifth and sixth emitter resistors $R_{E5}$ and $R_{E6}$ absorb influence owing to the Early Effects of the fifth and the sixth transistors Q5 and Q6. Resistance values of the fifth and the sixth emitter resistors $R_{E5}$ and $R_{E6}$ affects a current mirror ratio of the second current mirror circuit CM2 as do the third and the fourth emitter resistors $R_{E3}$ and $R_{E4}$. Terminals of the fifth and the sixth emitter resistors $R_{E5}$ and $R_{E6}$ are connected to emitters of the fifth and the sixth transistors Q5 and Q6, respectively. The other terminals of the fifth and the sixth emitter resistors $R_{E5}$ and $R_{E6}$ are both connected to the ground.

If the fifth and the sixth transistors Q5 and Q6 have the same property and the fifth and the sixth emitter resistors $R_{E5}$ and $R_{E6}$ have the same value, the second current signal $I_{OUT3}$ has the same current value of the first mirror current signal $I_{OUT2}$. Thus, $I_{OUT2}$ is equal to $I_{OUT3}$.

A current-to-voltage converting resistor $R_{OUT}$ has a terminal connected to a collector of the sixth transistor Q6 and another terminal supplied with the reference voltage $V_{Ref}$. The second mirror current signal $I_{OUT3}$ flows through the collector of the sixth transistor Q6 and the current-to-voltage converting resistor $R_{OUT}$, thereby a voltage drop from the reference voltage $V_{Ref}$ occurs at the current-to-voltage converting resistor $R_{OUT}$. The voltage drop makes a difference voltage between the reference $V_{Ref}$ and the collector voltage of the sixth transistor Q6. As described above, the differential amplifier device produces an output voltage signal $V_{OUT}$ as a difference voltage between the reference voltage $V_{Ref}$ and the collector voltage of the sixth transistor Q6, in response to first and second input voltage signals $V_{IN1}$ and $V_{IN2}$.

The output voltage signal $V_{OUT}$ responds accurately to the difference voltage between the two input voltage signals $V_{IN1}$ and $V_{IN2}$ without the effect of the difference between the reference voltage $V_{Ref}$ and the power supply voltage $V_{CC}$. The reason is as follows. In the differential amplifier device in accordance with this invention, the collector voltage of the first transistor Q1 can be set to a value closer to the power supply voltage $V_{CC}$ than to the reference voltage $V_{Ref}$. As a result, the output current signal $I_{OUT1}$ as a differential output is caused based on the collector voltage which is closer to the power supply voltage $V_{CC}$, and responds accurately to the potential difference between the two input voltage signals $V_{IN1}$ and $V_{IN2}$. Thus, if a collector voltage of the first transistor Q1 is set up so that the maximum value of the output current signal $I_{OUT1}$ is equal to the input-side maximum current $I_{MAX}$ of the Equation (1), the output current signal $I_{OUT1}$ is not influenced by the difference voltage between the reference voltage $V_{Ref}$ and the power supply voltage $V_{CC}$. As a result, the output voltage signal $V_{OUT}$ also responds accurately to the difference voltage between the two input voltage signals $V_{IN1}$ and $V_{IN2}$.

Here, description of a concrete example of this invention will be made.

In reference to FIG. 3, the third through the sixth emitter resistors $R_{E3}$–$R_{E6}$ are supposed as: $R_{E3}=R_{E4}=10k\Omega$, and $R_{E5}=R_{E6}=10k\Omega$. And the other conditions are also supposed to be same as the conditions in the example of the conventional device described hereinbefore. Therefore, it is supposed that $V_{CC}=3V$, $V_{IN2}=1.5V$, $V_{Ref}=1.5V$, $R_{E1}=R_{E2}=10k\Omega$, $R_{COM}=100k\Omega$, $R_{OUT}=100k\Omega$, and both $V_{BE1}$ and $V_{BE2}$, voltages between the emitters and the bases of the first and the second transistors Q1 and Q2, are about 0.7V.

As mentioned above, under this condition, the input-side maximum current of the differential amplifier device $I_{MAX}$, which is the maximum value of the collector current of the second transistor Q2, is given $7.3\mu$ A by the Equation (1).

As regards the structure of the device according to this invention, an electrical potential of the collector of the first transistor Q1 has a value closer to the power supply voltage $V_{CC}$ than to the reference voltage $V_{Ref}$ since the voltage drop at the third emitter resistor $R_{E3}$ and third transistor Q3, whose two terminals connected to each other in order to function as a diode, is small. Thus, $I_{OUT1}$, the value of the collector current of the first transistor Q1, can reach the maximum value $I_{MAX}$ (=$7.3\mu$ A). As understood from the relation that $R_{E3}$ and $R_{E5}$ are equal to $R_{E4}$ and $R_{E6}$, respectively, both of the first and the second current mirror circuits CM1 and CM2 have a current mirror ratio of 1. Therefore, $I_{OUT3}$, the current at the current-to-voltage converting resistor $R_{OUT}$, is equal to $I_{OUT1}$, the output current signal at the differential amplifier. As a result, the current having the maximum value $I_{MAX}$, which is 7.3µA, will flow through the current-to-voltage converting resistor $R_{OUT}$.

When $I_{MAX}$ flows, a collector voltage $V_{CMAX}$ at the sixth transistor Q6 is given by Equation (3):

$$V_{CMAX} = I_{MAX} \times R_{E6} + V_{CEMAX} \quad (3)$$

$$= 7.3\mu A \times 10k\Omega + V_{CEMAX}$$

$$= 0.073 + V_{CEMAX},$$

where $V_{CEMAX}$ is a voltage between an emitter and a collector of the sixth transistor Q6 with $I_{MAX}$ flowing therethrough.

The voltage between the emitter and the collector $V_{CEMAX}$ is at most about 0.3V, considering that $I_{MAX}$ is about 7.3µA. Therefore, the collector voltage $V_{CMAX}$ is given by Equation (4).

$$V_{CMAX} \leq 0.073V + 0.3V = 0.373V \quad (4)$$

Thus, Equation (5) is given by the above considerations.

$$V_{CMAX} + I_{MAX} \times R_{OUT} = 1.103V < V_{Ref} (=1.5V) \quad (5)$$

As understood from Equation (5), even if the difference voltage between the power supply voltage $V_{CC}$ and the reference voltage $V_{Ref}$ is large at the differential amplifier device according to the embodiment of this invention, the processed output current signal $I_{OUT1}$ is not limited by the difference voltage. Thus, this invention insures an enough margin for operation.

The circuit components of the differential amplifier device can have the following various modes within the scope of this invention.

The third through the sixth emitter resistors $R_{E3}$–$R_{E6}$ have a relation that $R_{E3}$ and $R_{E5}$ are equal to $R_{E4}$ and $R_{E6}$, respectively, in accordance with the above-mentioned embodiment, but may also have a relation that $R_{E3}$ and $R_{E5}$ are not equal to $R_{E4}$ and $R_{E6}$, respectively. In case where the third through the sixth emitter resistors $R_{E3}$–$R_{E6}$ have a relation that $R_{E3}$ and $R_{E5}$ are not equal to $R_{E4}$ and $R_{E6}$, respectively, the output current signal $I_{OUT}$ produced in the differential amplifier is independently amplified with the amplifying ratio of $R_{E3}$ to $R_{E4}$ at the first current mirror circuit CM1, and with the amplifying ratio of $R_{E5}$ to $R_{E6}$ at the second current mirror circuit CM2. As described above, choosing the amplifying ratios of $R_{E3}$ to $R_{E4}$ and of $R_{E5}$ to $R_{E6}$, makes it possible to control the output current signal in the differential amplifier device. In this case, there is no necessity of modifying circuits, such as the differential amplifier and the power supply circuit, except the current mirror circuits. This results in improved freedom in circuit designs. Moreover, the third through the sixth emitter resistors $R_{E3}$–$R_{E6}$ can function as an adjusting role to absorb variation in properties of the circuits constituting the device or the circuits connected to the device.

Figure 4:
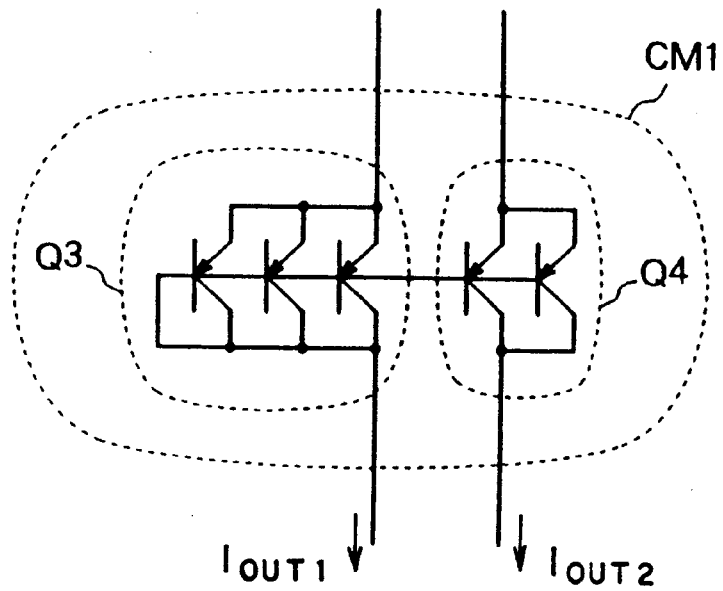
FIG. 4 is a first current mirror circuit diagram in FIG. 3.
Figure 5:
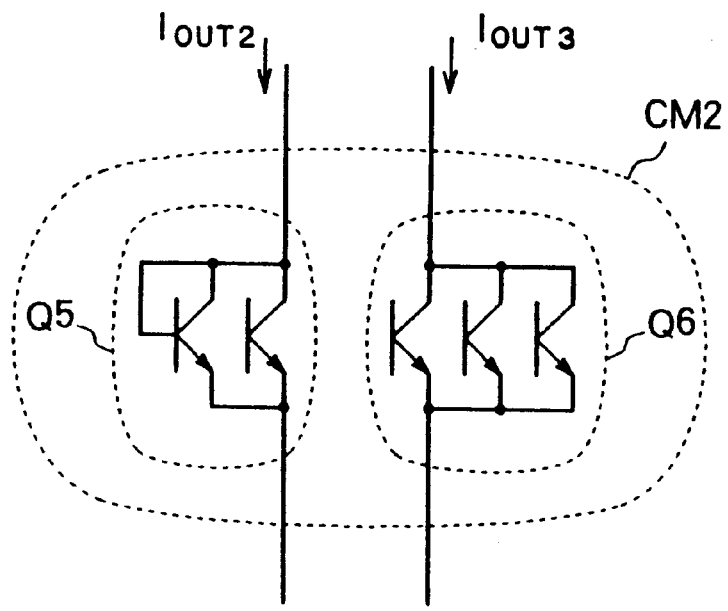
FIG. 5 is a second current mirror circuit diagram in FIG. 3.

The third and the fourth transistors Q3 and Q4 constituting the first current mirror circuit CM1 have been described by the example in which each of them consists of a single transistor element. However, each of them may comprise a plurality of transistor elements. For instance, as shown in FIG. 4, the third transistor Q3 may comprise three transistor elements and the fourth transistor Q4 may comprise two transistor elements. In case where the third and the fourth transistors Q3 and Q4 comprise a plurality of transistor elements, the current-voltage conversion ratio can be adjusted by the ratio of the number of transistor elements for the third transistor Q3 to the number of transistor elements for the fourth transistor Q4.

Each of the fifth and the sixth transistors Q5 and Q6 constituting the second current mirror circuit CM2 may also comprise a plurality of transistor elements as shown in FIG. 4.

As mentioned above, both of the third and the fourth transistors Q3 and Q4, which constitute the first current mirror circuit CM1, have been described to have the same property. However, the third and the fourth transistors may have different properties. In this case, the current-voltage conversion ratio can be adjusted by the ratio of an emitter area of the third transistor Q3 to an emitter area of the fourth transistor Q4. The fifth and the sixth transistors Q5 and Q6, which constitute that the second current mirror circuit, may also have different properties. In this case, the current-voltage conversion ratio can also be adjusted by the ratio of an emitter area of the fifth transistor Q5 to an emitter area of the sixth transistor Q6.

Figure 6:
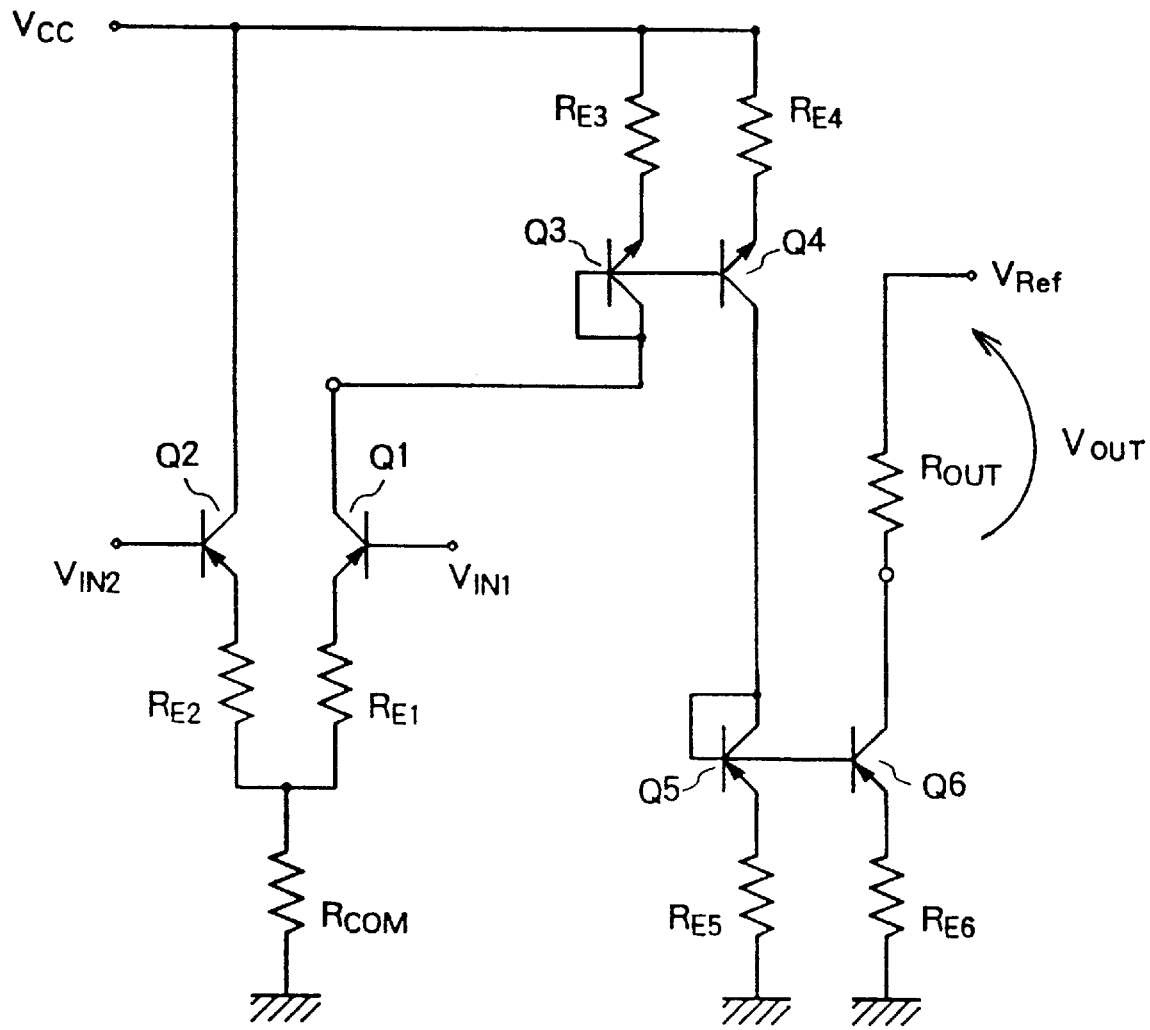
FIG. 6 is a circuit diagram of a differential amplifier device according to an alternative embodiment wherein the transistors have reversed polarity.

The above description has been made in connection with a case where the first, the second, the fifth, and the sixth transistors Q1, Q2, Q5, and Q6, are npn-type transistors, while the third and the fourth transistors Q3 and Q4 are pnp-type transistors. However, transistors having reversed polarity may be used. That is, as shown in FIG. 6, the first, the second, the fifth, and the sixth transistors Q1, Q2, Q5, and Q6, may be pnp-type transistors while the third and the fourth transistors Q3 and Q4 are npn-type transistors. In this case, the power supply voltage $V_{CC}$ and the reference voltage $V_{Ref}$, and the first and the input voltage signals $V_{IN1}$ and $V_{IN2}$, are all negative in the voltage polarity.

As described above, even if the difference voltage between the reference voltage connected to a terminal of the current-to-voltage converting resistor and the power supply voltage supplied to the differential amplifier is large, the electric current which can be processed is not limited, according to this invention.

What is claimed is:

1. A differential amplifier device comprising a differential amplifier for producing an output current as a differential output corresponding to a difference in voltage between two input voltage signals, and a current-to-voltage converter for converting the output current to a voltage, wherein:

said differential amplifier comprises a first transistor and a second transistor which have substantially the same properties and which are connected differentially, said first transistor having an output terminal for producing a first current signal as said differential output; and said current-to-voltage converter comprises (i) a first current mirror circuit comprising a third transistor connected to said output terminal of said first transistor for functioning as a diode to pass said first current signal, and a fourth transistor connected to said third transistor for producing a second current signal corresponding to said first current signal flowing into said third transistor, (ii) a second current mirror circuit comprising a fifth transistor connected in series to said fourth transistor for functioning as a diode to pass said second current signal produced by said fourth transistor, and a sixth transistor connected to said fifth transistor for producing a third current signal corresponding to said second current signal flowing into said fifth transistor, and (iii) a current-to-voltage converting resistor for converting said third current signal to a voltage signal and having a first terminal connected in series to said sixth transistor and a second terminal supplied with a reference voltage.

2. A differential amplifier device as claimed in claim 1, wherein:
said third and said fourth transistors are different in polarity from said first and said second transistors; and
said fifth and said sixth transistors have the same polarity as said first and said second transistors.

3. A differential amplifier device as claimed in claim 2, wherein:
said first, said second, said fifth, and said sixth transistors are npn-type transistors; and
said third and said fourth transistors are pnp-type transistors.

4. A differential amplifier device comprising a differential amplifier for producing an output current as a differential output corresponding to a difference in voltage between two input voltage signals, and a current-to-voltage converter for converting the output current to a voltage, wherein:
said differential amplifier comprises a first transistor and a second transistor which have substantially the same properties and which are connected differentially, said first transistor having an output terminal for producing a first current signal as said differential output;
said current-to-voltage converter comprises (i) a first current mirror circuit comprising a third transistor connected to said output terminal of said first transistor for functioning as a diode to pass said first current signal, and a fourth transistor connected to said third transistor for producing a second current signal corresponding to said first current signal flowing into said third transistor, (ii) a second current mirror circuit comprising a fifth transistor connected in series to said fourth transistor for functioning as a diode to pass said second current signal produced by said fourth transistor, and a sixth transistor connected to said fifth transistor for producing a third current signal corresponding to said second current signal flowing into said fifth transistor, and (iii) current-to-voltage converting resistor for converting said third current signal to a voltage signal and having a first terminal connected in series to said sixth transistor and a second terminal supplied with a reference voltage;
said first, said second, said fifth, and said sixth transistors are npn-type transistors;
said third and said fourth transistors are pnp-type transistors;
said first transistor has a first collector terminal functioning as said output terminal;
said second transistor has a second collector terminal connected to a power supply voltage to be supplied with a positive voltage;
said third transistor has a third collector terminal and a first base terminal both connected to said first collector terminal;
said fourth transistor has a second base terminal connected to said first base terminal, and a fourth collector terminal to output said second current signal;
said fifth transistor has a fifth collector terminal and a third base terminal both connected to said fourth collector terminal;
said sixth transistor has a fourth base terminal connected to said third base terminal, and a sixth collector terminal to output said third current signal; and
said first terminal of said current-to-voltage converting resistor is connected to said sixth collector terminal.

5. A differential amplifier device as claimed in claim 4, further comprising a first resistor and a second resistor, wherein:
said first resistor has a first terminal connected to an emitter terminal of said third transistor and a second terminal connected to said power supply voltage; and
said second resistor has a first terminal connected to an emitter terminal of said fourth transistor and a second terminal connected to the power supply voltage.

6. A differential amplifier device as claimed in claim 5, wherein:
said current-to-voltage converter has a current-voltage conversion ratio, said current-voltage conversion ratio being capable of being adjusted by a ratio of a value of said first resistor to a value of said second resistor.

7. A differential amplifier device as claimed in claim 4, further comprising a third resistor and a fourth resistor, wherein;
said third resistor has a first terminal connected to an emitter terminal of said fifth transistor and a second terminal connected to ground.

8. A differential amplifier device as claimed in claim 7, wherein:
said current-to-voltage converter has a current-voltage conversion ratio, said current-voltage conversion ratio being capable of being adjusted by a ratio of a value of the third resistor to a value of the fourth resistor.

9. A differential amplifier device as claimed in claim 2, wherein:
said first, said second, said fifth, and said sixth transistors are pnp-type transistors; and
said third and said fourth transistors are npn-type transistors.

10. A differential amplifier device comprising a differential amplifier for producing an output current as a differential output corresponding to a difference in voltage between two input voltage signals, and a current-to-voltage converter for converting the output current to a voltage, wherein:
said differential amplifier comprises a first transistor and a second transistor which have substantially the same properties and which are connected differentially, said first transistor having an output terminal for producing a first current signal as said differential output;
said current-to-voltage converter comprises (i) a first current mirror circuit comprising a third transistor connected to said output terminal of said first transistor for functioning as a diode to pass said first current signal, and a fourth transistor connected to said third transistor for producing a second current signal corresponding to said first current signal flowing into said third transistor, (ii) a second current mirror circuit comprising a fifth transistor connected in series to said fourth transistor for functioning as a diode to pass said second current signal produced by said fourth transistor, and a sixth transistor connected to said fifth transistor for producing a third current signal corresponding to said second current signal flowing into said fifth transistor, and (iii) current-to-voltage converting resistor for converting said third current signal to a voltage signal and having a first terminal connected in series to said sixth transistor and a second terminal supplied with a reference voltage;
said first, said second, said fifth, and said sixth transistors are pnp-type transistors;
said third and said fourth transistors are npn-type transistors;

said first transistor has a first emitter terminal functioning as said output terminal;

said second transistor has a second emitter terminal connected to a power supply voltage to supply a negative voltage;

said third transistor has a third emitter terminal and a first base terminal both connected to said first emitter terminal;

said fourth transistor has a second base terminal connected to said first base terminal, and a fourth emitter terminal to output said second current signal;

said fifth transistor has a fifth emitter terminal and a third base terminal both connected to said fourth emitter terminal;

said sixth transistor has a fourth base terminal connected to said third base terminal, and a sixth emitter terminal to output said third current signal; and said first terminal of said current-to-voltage converting resistor is connected to said sixth emitter terminal.

11. A differential amplifier device as claimed in claim 10, further comprising a first resistor and a second resistor, wherein:

said first resistor has a first terminal connected to a collector terminal of said third transistor and a second terminal connected to said power supply voltage.

12. A differential amplifier device as claimed in claim 11, wherein:

said current-to-voltage converter has a current-voltage conversion ratio, said current-voltage conversion ratio being capable of being adjusted by a ratio of a value of the first resistor to a value of the second resistor.

13. A differential amplifier device as claimed in claim 10, further comprising a third resistor and a fourth resistor, wherein:

said third resistor has a first terminal connected to a collector terminal of said fifth transistor and a second terminal connected to ground; and said fourth resistor has a first terminal connected to a collector terminal of said sixth transistor and a second terminal connected to the ground.

14. A differential amplifier device as claimed in claim 13, wherein:

said current-to-voltage converter has a current-voltage conversion ratio, said current-voltage conversion ratio being capable of being adjusted by a ratio of a value of said third resistor to a value of said fourth resistor.

15. A differential amplifier device comprising a differential amplifier for producing an output current as a differential output corresponding to a difference in voltage between two input voltage signals, and a current-to-voltage converter for converting the output current to a voltage, wherein:

said differential amplifier comprises a first transistor and a second transistor which have substantially the same properties and which are connected differentially, said first transistor having an output terminal for producing a first current signal as said differential output;

said current-to-voltage converter comprises (i) a first current mirror circuit comprising a third transistor connected to said output terminal of said first transistor for functioning as a diode to pass said first current signal, and a fourth transistor connected to said third transistor for producing a second current signal corresponding to said first current signal flowing into said third transistor, (ii) a second current mirror circuit comprising a fifth transistor connected in series to said fourth transistor for functioning as a diode to pass said second current signal produced by said fourth transistor, and a sixth transistor connected to said fifth transistor for producing a third current signal corresponding to said second current signal flowing into said fifth transistor, and (iii) current-to-voltage converting resistor for converting said third current signal to a voltage signal and having a first terminal connected in series to said sixth transistor and a second terminal supplied with a reference voltage;

said third and said fourth transistors are different in polarity from said first and said second transistors;

said fifth and said sixth transistors have the same polarity as said first and said second transistors;

each of said third and said fourth transistors comprises at least one transistor element of a predetermined size; and said first current mirror circuit has a current-voltage conversion ratio, said current-voltage conversion ratio being capable of being adjusted by a ratio of transistor elements constituting said third transistor to transistor elements constituting said fourth transistor.

16. A differential amplifier device comprising a differential amplifier for producing an output current as a differential output corresponding to a difference in voltage between two input voltage signals, and a current-to-voltage converter for converting the output current to a voltage, wherein:

said differential amplifier comprises a first transistor and a second transistor which have substantially the same properties and which are connected differentially, said first transistor having an output terminal for producing a first current signal as said differential output;

said current-to-voltage converter comprises (i) a first current mirror circuit comprising a third transistor connected to said output terminal of said first transistor for functioning as a diode to pass said first current signal, and a fourth transistor connected to said third transistor for producing a second current signal corresponding to said first current signal flowing into said third transistor, (ii) a second current mirror circuit comprising a fifth transistor connected in series to said fourth transistor for functioning as a diode to pass said second current signal produced by said fourth transistor, and a sixth transistor connected to said fifth transistor for producing a third current signal corresponding to said second current signal flowing into said fifth transistor, and (iii) current-to-voltage converting resistor for converting said third current signal to a voltage signal and having a first terminal connected in series to said sixth transistor and a second terminal supplied with a reference voltage;

said third and said fourth transistors are different in polarity from said first and said second transistors;

said fifth and said sixth transistors have the same polarity as said first and said second transistors;

each of said fifth and said sixth transistors comprises at least one transistor element of a predetermined size; and said second current mirror circuit has a current-voltage conversion ratio, said current-voltage conversion ratio being capable of being adjusted by a ratio of transistor elements constituting said fifth transistor to transistor elements constituting said sixth transistor.

17. A differential amplifier device as claimed in claim 4, wherein said first current mirror circuit comprises said third and said fourth transistors, and said third and said fourth transistors have substantially the same properties.

18. A differential amplifier device as claimed in claim 4, wherein said second current mirror circuit comprises said fifth and said sixth transistors, and said fifth and said sixth transistors have substantially the same properties.

19. A differential amplifier device as claimed in claim 10, wherein said first current mirror circuit comprises said third and said fourth transistors, and said third and said fourth transistors have substantially the same properties.

20. A differential amplifier device as claimed in claim 10, wherein said second current mirror circuit comprises said fifth and said sixth transistors, and said fifth and said sixth transistors have substantially the same properties.

* * * * *